(12) United States Patent
Miura et al.

(10) Patent No.: US 7,301,104 B2
(45) Date of Patent: Nov. 27, 2007

(54) DOUBLE-SIDED FLEXIBLE PRINTED CIRCUITS

(75) Inventors: Kazuto Miura, Kanagawa (JP); Hiroshi Yamane, Kanagawa (JP); Yoshiyuki Nakai, Kanagawa (JP); Kenichi Toda, Kanagawa (JP)

(73) Assignee: J.S.T. Mfg. Co., Ltd., Osaka (JP)

( * ) Notice: Subject to any disclaimer, the term of this patent is extended or adjusted under 35 U.S.C. 154(b) by 0 days.

(21) Appl. No.: 11/330,157

(22) Filed: Jan. 12, 2006

(65) Prior Publication Data

US 2006/0157271 A1 Jul. 20, 2006

(30) Foreign Application Priority Data

Jan. 17, 2005 (JP) ............................. 2005-009607

(51) Int. Cl.
*H05K 1/00* (2006.01)
(52) U.S. Cl. .................................. 174/254; 174/117 F
(58) Field of Classification Search ................ 174/254, 174/117 F, 117 FF
See application file for complete search history.

(56) References Cited

U.S. PATENT DOCUMENTS 4,798,918 A * 1/1989 Kabadi et al. ................ 174/36
5,274,195 A * 12/1993 Murphy et al. ......... 174/117 FF
5,598,627 A * 2/1997 Saka et al. ..................... 29/861
5,844,783 A * 12/1998 Kojima ........................ 361/777
6,858,921 B2 * 2/2005 Kashiwagi et al. .......... 257/668

FOREIGN PATENT DOCUMENTS

| JP | 06-132666 A | | 5/1994 |
| JP | 2000123898 A | * | 4/2000 |
| JP | 2000156262 A | * | 6/2000 |
| JP | 2002-094203 A | | 3/2002 |
| JP | 2004-172490 A | | 6/2004 |
| JP | 2004-335547 A | | 11/2004 |
| JP | 2004-335548 A | | 11/2004 |

* cited by examiner

*Primary Examiner*—Ishwar (I. B.) Patel
(74) *Attorney, Agent, or Firm*—Rader, Fishman & Grauer PLLC (57) ABSTRACT

A double-sided flexible printed circuit comprises: an electrically insulating base; a first copper layer having a first conductive pattern; a second copper layer having a second conductive pattern, the second conductive pattern disposed offset from the first conductive pattern; and electrically insulating coverlays. A first area opposing a first contact point of first contacts that press upon the first conductive patterns, is reinforced by copper foil extending from the second conductive patterns, and a second area opposing a second contact point of second contacts that press upon the second conductive patterns, is reinforced by copper foil extending from the first conductive patterns.

5 Claims, 6 Drawing Sheets

DOUBLE-SIDED FLEXIBLE PRINTED CIRCUITS

This application is based on and claims the benefit of priority from Japanese Patent Application No. 2005-009607, filed on Jan. 17, 2005, the content of which is incorporated herein by reference.

BACKGROUND OF THE INVENTION

1. Field of the Invention

The present invention relates to flexible flat cables (printed circuits that are flexible) such as FPCs (Flexible Printed Circuits), FFCs (Flexible Flat Cables), and the like. In this specification, a flexible flat cable is generically referred to as an FPC. The present invention relates, in particular, to a connecting structure for a terminal of a double-sided FPC connected to an FPC connector.

2. Related Art

In electronic devices in recent years, flexible flat cables (FPCs) are used for connecting printed circuit boards and electronic component modules mounted in portable information devices typified by, for example, DVCs (Digital Video Cameras), DSCs (Digital Still Cameras), cell-phones, and PDAs (Personal Digital Assistants).

An FPC connector surface-mounted on a printed circuit board (what is called a surface-mounted FPC connector) is provided with: an insulating housing in which an insertion area, into which an FPC is inserted, is formed, and a plurality of contacts mounted side by side at a prescribed pitch in the housing. In order to make the FPC and the contacts touch, for example, a cover-housing that opens and closes is provided at the insertion area.

In increasing the mounting density of FPC connectors that are surface-mounted on a printed circuit board, lowering of mounting height (lowering of profile) and reduction of mounting area are required, and progress is being made with multi-pin and narrow pitch contacts arrayed on these surface-mounted FPC connectors.

As an FPC that is compatible with these types of surface-mounted FPC connectors, double-sided FPCs that realize electrical connections between printed circuit boards by a simplified structure, in comparison to conventional cases, are being invented (for example, see Patent Document 1). The abovementioned flexible circuit boards (double-sided FPCs) are used as cables for interconnecting printed circuit boards, independent devices, and the like.

The double-sided FPC according to Patent Document 1 includes pads for external connections, arranged at two ends of the top face of a base made of polyimide, pads for external connections, arranged at two ends of the bottom face of the base made of polyimide, conductive patterns, electrically connecting, respectively, each pad at the two ends of the top and bottom faces, a gold plating layer applied to the front face of each pad, and a coating layer made of polyimide for protecting the conductive patterns.

Patent Document 1: Japanese Patent Application, Laid Open No. 2002-94203.

Figure 8:
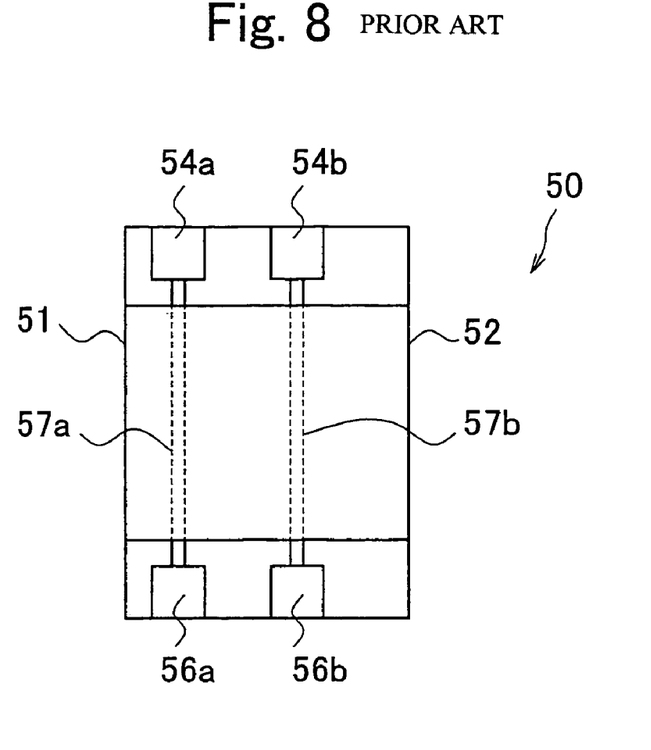
FIG. 8 is a plan view of a double-sided FPC according to conventional technology.
Figure 9:
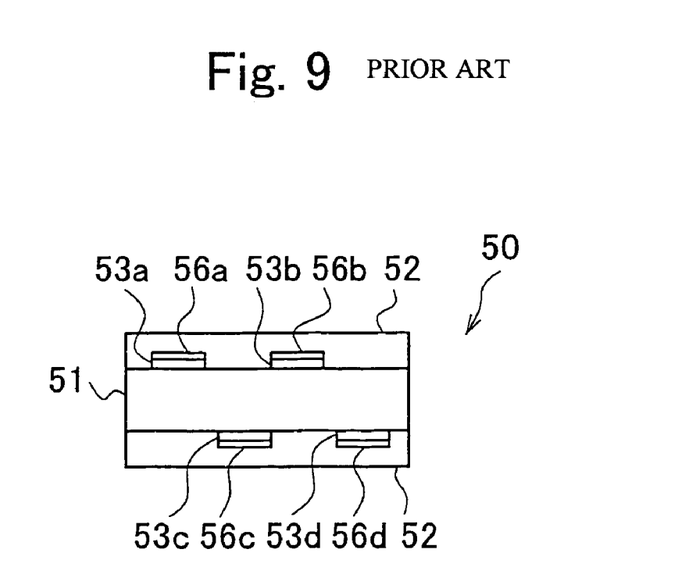
FIG. 9 is a front view of the double-sided FPC according to the conventional technology.

FIG. 8 of the present Application is a plan view of the double-sided FPC, showing a first embodiment of Patent Document 1. FIG. 9 of the present Application is a front view of the double-sided FPC showing the first embodiment of Patent Document 1. FIGS. 8 and 9 of the present application correspond to FIGS. 1 and 2 of Patent Document 1.

In FIGS. 8 and 9 of the present Application, the double-sided FPC 50 includes the pads for external connections, arranged at the two ends of the top face of the base 51 made of polyimide, the pads for external connections, arranged at the two ends of the bottom face of the base 51 made of polyimide, the conductive patterns, electrically connecting, respectively, each pad at the two ends of the top and bottom faces, the gold plating layer applied to the front face of each pad, and the coating layer 52 made of polyimide for protecting the conductive patterns.

In FIGS. 8 and 9, at one end of the front face of the base 51, the pads 53*a* and 53*b* are arranged, and the gold plating layers 56*a* and 56*b* are formed on the front faces of the pads 53*a* and 53*b*. At the other end of the front face of the base 51, the pads (not shown in the figure) are arranged, and the gold plating layers 54*a* and 54*b* are formed on the front faces of the pads.

The gold plating layers 54*a* and 54*b* are connected to a connector arranged on a first printed circuit board, and the gold plating layers 56*a* and 56*b* are connected to a connector arranged on a second printed circuit board. The gold plating layer 54*a* and the gold plating layer 56*a* are electrically connected, via the conductive pattern 57*a*. In the same way, the gold plating layer 54*b* and the gold plating layer 56*b* are electrically connected, via the conductive pattern 57*b*.

In FIG. 9, at one end of the rear face of the base 51, the pads 53*c* and 53*d* are arranged, and gold plating layers 56*c* and 56*d* are formed on the front faces of the pads 53*c* and 53*d*. At the other end of the rear face of the base 51, the pads (not shown in the figure) are arranged, and twin gold plating layers (not shown) are formed on the front faces of the pads.

The gold plating layers 56*c* and 56*d* are connected to a connector arranged on the second printed circuit board. The twin gold plating layers formed at the other end of the rear face of the base 51 are connected to a connector arranged on the first printed circuit board. The gold plating layer 56*c* and one of the gold plating layers formed at the other end of the rear face of the base 51 are electrically connected via a conductive pattern formed on the rear face of the base 51. In the same way, the gold plating layer 56*d* and the other of the gold plating layers formed at the other end of the rear face of the base 51 are electrically connected via a conductive pattern formed on the rear face of the base 51.

Although only one pair each of the pads and the conductive patterns on the front and rear faces of the base 51 is shown in FIGS. 8 and 9, many pads and conductive patterns may additionally be formed on the front and rear faces of the base 51; and by the pads and conductive patterns formed on the front face of the base 51 being staggered by a half pitch, with regard to the pads and conductive patterns formed on the rear face of the base 51, a narrow-pitch FPC is realized. In these types of narrow-pitch FPCs, pad width is often approximately the same as the conductive pattern width.

Figure 10:
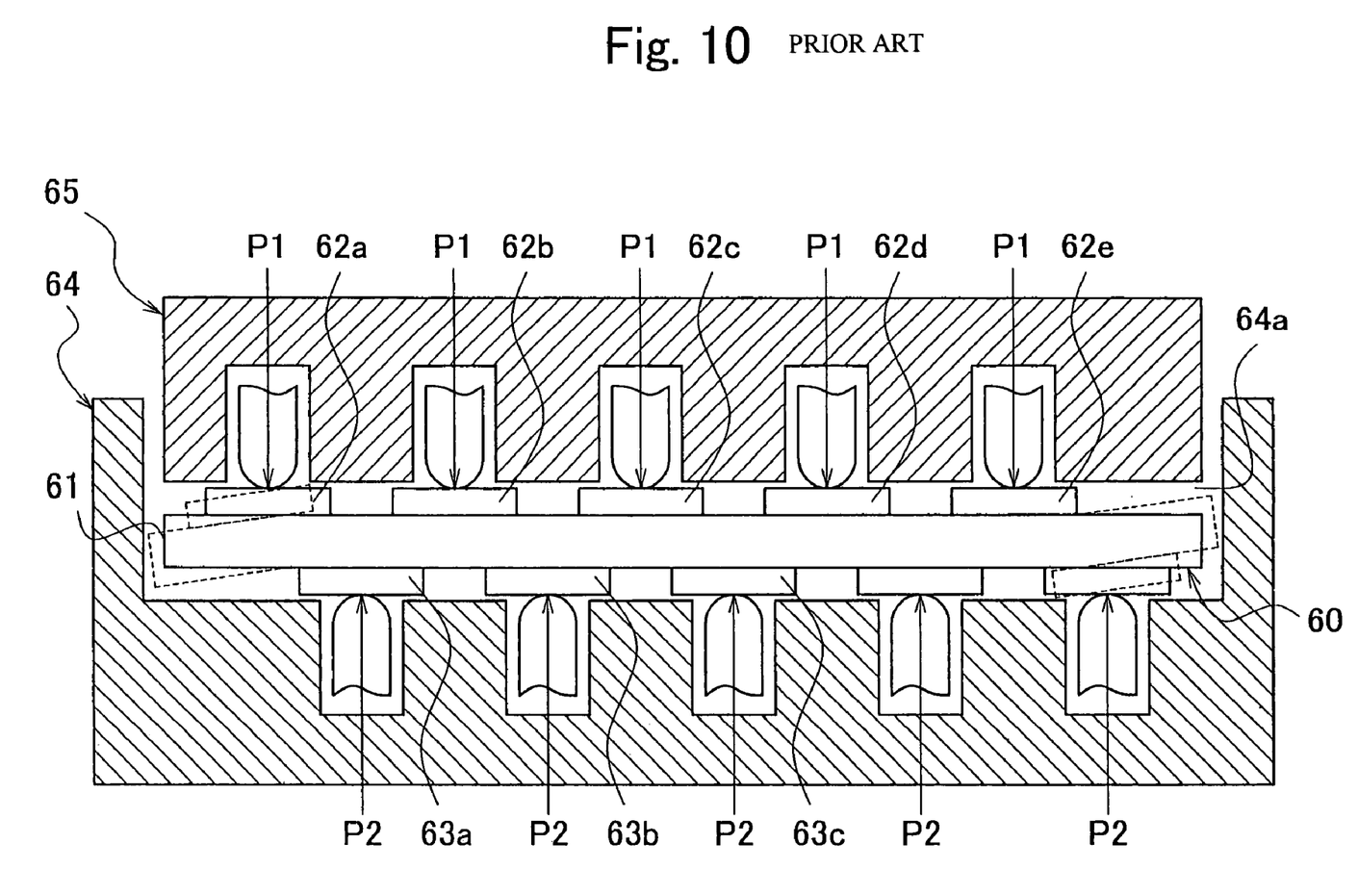
FIG. 10 is a front view of a double-sided FPC according to the conventional technology in which pad widths are approximately the same as conductive pattern widths.

FIG. 10 is a front view of a double-sided FPC according to conventional technology in which the width of the pads is approximately the same as the width of the conductive patterns. In FIG. 10, at one end of the front face of the base 61 made of polyimide, a plurality of pads 62*a* to 62*e* for external connections is provided, and at one end of the rear face of the base 61, a plurality of pads 63*a* to 63*e* for external connections is provided. On these pads 62*a* to 62*e* and pads 63*a* to 63*e*, the gold plating layer (not shown in the figure), for example, may be formed.

In FIG. 10, the plurality of pads 62*a* to 62*e* is disposed at equal intervals (pitch), and the plurality of pads 63*a* to 63*e* is also disposed at equal intervals (pitch). By staggering the pitch of the pads 62*a* to 62*e* with regard to the pitch of the pads 63*a* to 63*e*, by a half pitch in the direction of disposition, a narrow-pitch double-sided FPC is realized.

The double-sided FPC 60 shown in FIG. 10 is connected, for example, to a connector composed of a housing 64 and a cover housing 65. The double-sided FPC 60, which is inserted into a concave region 64a provided in the housing 64, is pressed upon by the cover housing 65 that closes the concave region 64a. At one end that is connected to the connector, referred to as an edge connector, by first contacts provided on the connector, a force P1 acts on each pad 62 to 62e. Moreover, by second contacts provided on the connector, a force P2 acts on each pad 63a to 63e.

In the double-sided FPC 60 shown in FIG. 10, if continuously pressed upon by the first and the second contacts for a long period of time, it has been ascertained that a deformation remains at both ends of the line in which the pads are disposed on the base 61 made from polyimide. As shown by the dashed lines in FIG. 10, it has been ascertained that one end of the base 61 deforms in the direction in which the force P1 acts, and the other end of the base 61 deforms in the direction in which the force P2 acts.

In the central area of the base 61 shown in FIG. 10, by the pads on the front face and the pads on the rear face reciprocally overlapping through the base 61, the directionally opposed forces P1 and P2 cancel one another out, and deformation of the base 61 is prevented. However, at the ends of the base 61, as in a cantilever beam, if the force P1 or P2 continues to act, and with the passage of time, the elastic deformation limit is exceeded, deformation becomes permanent, and the phenomenon of creep occurs.

In the double-sided FPC 60 shown in FIG. 10, the board thickness of the base 61 is, for example, 25 micrometers, and even when bonding layers, copper foil layers forming the pads, and plating layers (for example, gold plating on nickel plating) are added, the board thickness of the double-sided FPC 60, that is an edge connector, is, for example, 0.12 mm. In order to realize a connector with a low profile of about 1 mm, this type of thin double-sided FPC is required. In the FPC 50 shown in FIGS. 8 and 9, if the base 51 is made thin, similar problems become apparent.

In the double-sided FPC 60 shown in FIG. 10, since inter-electrode walls face against the direction in which the forces P1 and P2 act, deformation of both ends of the base 61 is very slight (for example, of a level that does not affect contact conductivity performance, such as contact resistance with contacts).

However, impression marks due to the contact points of the contacts on the pads 62a and 63e, are different from impression marks due to the contact points of the contacts on the pads 62b to 62e and the pads 63a to 63d. The impression marks on the pads 62a and 63e are shallow, but the impression marks on the other pads are deep. The fact that contact pressure of the contacts differs with positions of the pads is a problem from the viewpoint of reliability.

In the double-sided FPC, in which copper foil is laminated on both faces of an insulating base, the copper foil is etched to form a plurality of conductive patterns, and the conductive patterns are exposed on a terminal for connecting with contacts, a new connecting structure is required that has a structure in which, even if the terminal for the contacts is thin, and without changing board thickness, the two ends of the base do not deform. This topic may be considered an object of the present invention.

SUMMARY OF THE INVENTION

In light of these types of problems, the present invention has as an object the provision of a double-sided FPC for connecting to an FPC connector with multi-pin contacts, narrow pitch and a low profile, the double-sided FPC having a structure in which, even if a terminal of the double-sided FPC is of thin film, the two ends of the base do not deform due to contacts.

To realize the abovementioned object, the present invention includes a new double-sided FPC, described below, in which an area, opposing a contact point of the contacts that press upon one conductive pattern disposed at an end of the terminal of the double-sided FPC, has, by copper foil extending from another conductive pattern disposed at the end, a reinforced structure.

In a first aspect of the present invention, in the double-sided FPC, copper foil is laminated on both faces of an insulating base, the copper foil is etched to form pluralities of first and second conductive patterns, the pluralities of first and second conductive patterns are coated with an insulating coverlay, the pluralities of first and second conductive patterns are disposed in parallel and exposed on the terminal for connecting to a connector, the plurality of first conductive patterns disposed on one face of the terminal is staggered by a half pitch with respect to the plurality of second conductive patterns disposed on the other face of the terminal, the plurality of first conductive patterns is pressed upon at contact points of a plurality of first contacts arranged on the connector, and the plurality of second conductive patterns is pressed upon at contact points of a plurality of second contacts arranged on the connector, and an area, opposing a contact point of the first contacts that press upon the first conductive patterns disposed at one end, is reinforced by the copper foil extending from the second conductive patterns disposed at the one end, and an area, opposing a contact point of the second contacts that press upon the second conductive patterns disposed at the other end, is reinforced by the copper foil extending from the first conductive patterns disposed at the other end.

In the double-sided FPC according to the first aspect of present invention, the copper foil is laminated on both faces of the insulating base. The copper foil is etched to form the pluralities of first and second conductive patterns. The first and the second conductive patterns are coated with the insulating coverlay, and the first and the second conductive patterns are disposed in parallel and exposed on the terminal for connecting to the connector.

The base is, for example, formed as a film, made of a flexible substrate such as insulating polyester, polyimide, or the like. By laminating the copper foil on both faces of the base, the copper foil that forms the first and the second conductive patterns may be bonded to the base. The coverlay may be formed of thin film of polyester, polyimide, or the like, to coat the plurality of first and second conductive patterns. The fact that the coverlay coats the pluralities of first and second conductive patterns, means that the coverlay extends over and is bonded to the pluralities of first and second conductive patterns. The coverlay is bonded to the pluralities of first and second conductive patterns and is also bonded to the base surface that is exposed between the first and the second conductive patterns.

The terminal for connecting to the connector is not coated with the insulating coverlay, and the pluralities of first and second conductive patterns are exposed. The first and second conductive patterns of the terminal are in conductive contact with the contacts provided in the connector. The plurality of conductive patterns is disposed in parallel on FPC end-terminals connected to the connector, which are also known as edge contacts or edge connectors. In cases of double-sided FPCs, they are also known as double-sided edge connectors. The pluralities of conductive patterns forming these connective faces may, for example, have a nickel-gold plating.

The double-sided FPC according to the present invention may be configured so that the pluralities of first and second conductive patterns are disposed in parallel and separated, between the base and the coverlay, the terminal with coverlay is peeled for a prescribed length only, and the first and second conductive patterns are exposed, to form the terminal.

In the double-sided FPC according to the first aspect of the present invention, the plurality of first conductive patterns disposed on one face of the terminal is staggered by a half pitch with respect to the plurality of second conductive patterns disposed on the other face of the terminal. The plurality of first conductive patterns is pressed upon at the contact points of the plurality of first contacts arranged on the connector. Moreover, the plurality of second conductive patterns is pressed upon at the contact points of the plurality of second contacts arranged on the connector.

In the double-sided FPC according to the present invention, since the plurality of first conductive patterns and the plurality of second conductive patterns are disposed staggered by a half pitch, with regard to electrical signal wires (number of poles) for transmission by the double-sided FPC, the width of the double-sided FPC can be narrowed. Furthermore, the width of the connector connected to the double-sided FPC can be narrowed. The first conductive patterns and the second conductive patterns are generally the same in number; however, the present invention does not exclude cases in which the first conductive patterns and the second conductive patterns are different in number.

The connector applicable to the double-sided FPC according to the present invention is preferably a ZIF (Zero Insertion Force) connector. For example, this type of ZIF connector is provided with an insulating housing in which an insertion area, into which an FPC is inserted, is formed, and pluralities of first and second contacts mounted side by side at a prescribed pitch on the housing; and in order to press upon and make contact between the contact points of these first and second contacts and the double-sided FPC, a cover housing that opens and closes, for example, is provided at the insertion area. The first and the second contacts may, for example, be cantilever-type plate springs.

In the double-sided FPC according to the first aspect of the present invention, the area opposing a contact point of the first contacts, which presses upon the first conductive patterns disposed at one end, is reinforced by the copper foil extending from the second conductive patterns disposed at the one end. Moreover, the area opposing a contact point of the second contacts, which presses upon the second conductive patterns disposed at the other end, is reinforced by the copper foil extending from the first conductive patterns disposed at the other end.

In the double-sided FPC of the present invention, the thickness of the terminal thereof is, for example, about 0.12 mm. In the double-sided FPC with this type of thin terminal, as it is-similar to conventional cases, with force from the contact points of the contacts, both ends of base deform due to creep.

The double-sided FPC of the present invention has a structure in which the area opposing the contact point position of the contacts that press upon one of the conductive patterns disposed at an end of the terminal, is reinforced by the copper foil in the other conductive pattern being extended, and flexure of the end of the base is prevented. In the areas opposing the contact point positions of the contacts, by the copper foil (that is, a thin metal plate) being bonded to the exposed faces of the base, the rigidity of both ends of the base is reinforced. By the copper foil being laminated (bonded) to the base, the second moment of area is considered to be higher than the bending moment of the terminal.

The copper foil that extends from the other conductive pattern may, for example, extend in a rectangular shape from the conductive pattern like an open stub, or may extend in a semicircular shape, preferably having a large area with the contact point position as center. This reinforced area can be made by a process of etching the plurality of first and second conductive patterns. In the double-sided FPC of the present invention, both ends of the terminal can be reinforced without changing the conventional terminal board thickness.

In a second aspect of the double-sided FPC as described in the first aspect of the present invention, the board thickness of the base is 25 micrometers.

In a third aspect of the double-sided FPC as described in the first or the second aspect of the present invention, the first and the second conductive patterns on the terminal have a pitch of 0.4 mm.

The terminal of the double-sided FPC of the present invention has a structure in which the area opposing the contact point position of the contact that presses upon one of the conductive patterns disposed at an end, is reinforced by the copper foil in the other conductive pattern being extended; and permanent deformation, which occurs in the two flanks of the terminal of the double-sided FPCs in conventional cases, is prevented from occurring. Furthermore, in the double-sided FPC of the present invention, it is possible to strengthen both flanks of the terminal of the double-sided FPC without changing the board thickness of the terminal.

DETAILED DESCRIPTION OF THE INVENTION

A best mode for implementing the present invention is explained below, referring to the drawings.

Figure 1:
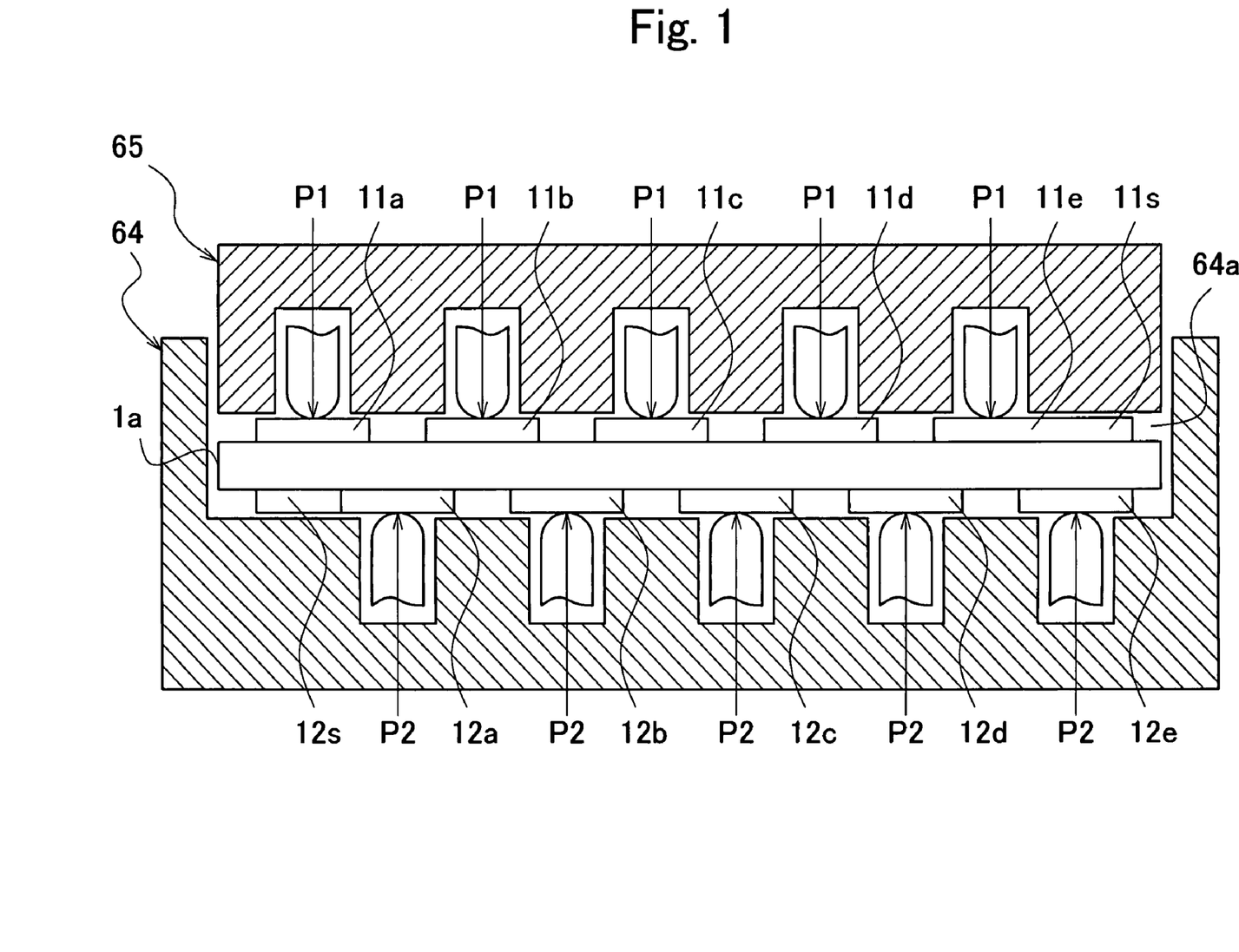
FIG. 1 is a top view of an embodiment of a double-sided FPC according to the present invention.
Figure 2:
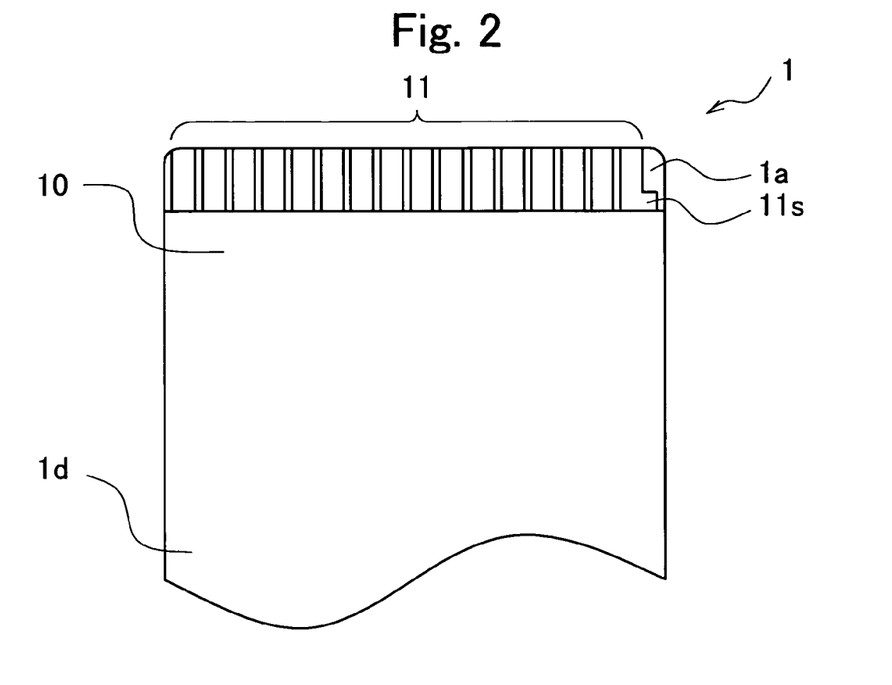
FIG. 2 is a plan view of the double-sided FPC according to Embodiment 1, and is a view of the front face of the double-sided FPC.
Figure 3:
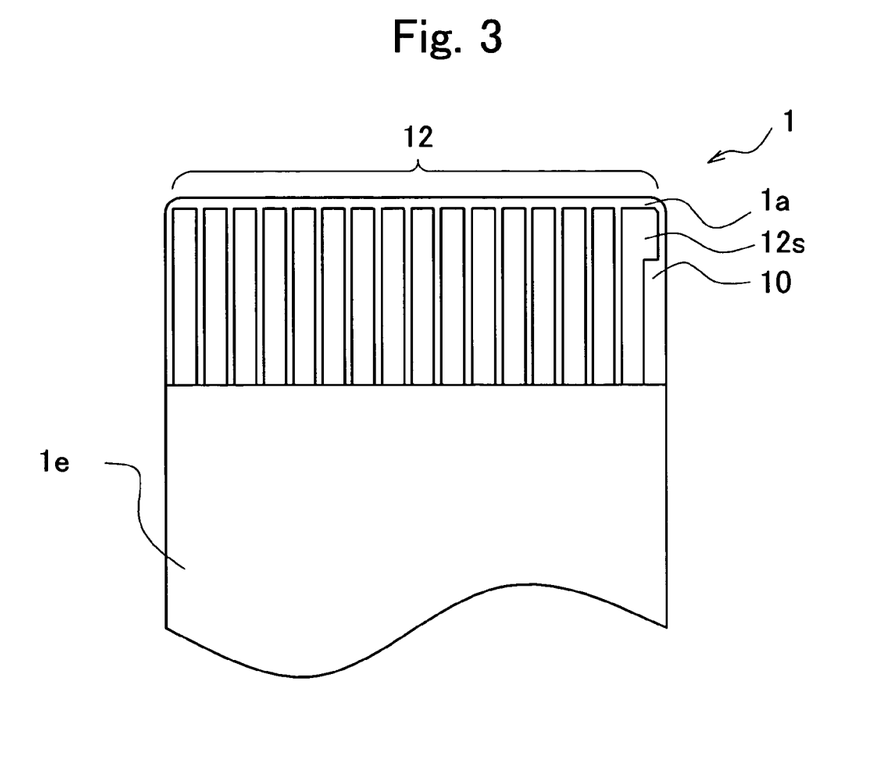
FIG. 3 is a plan view of the double-sided FPC according to Embodiment 1, and is a view of the rear face of the double-sided FPC.
Figure 4:
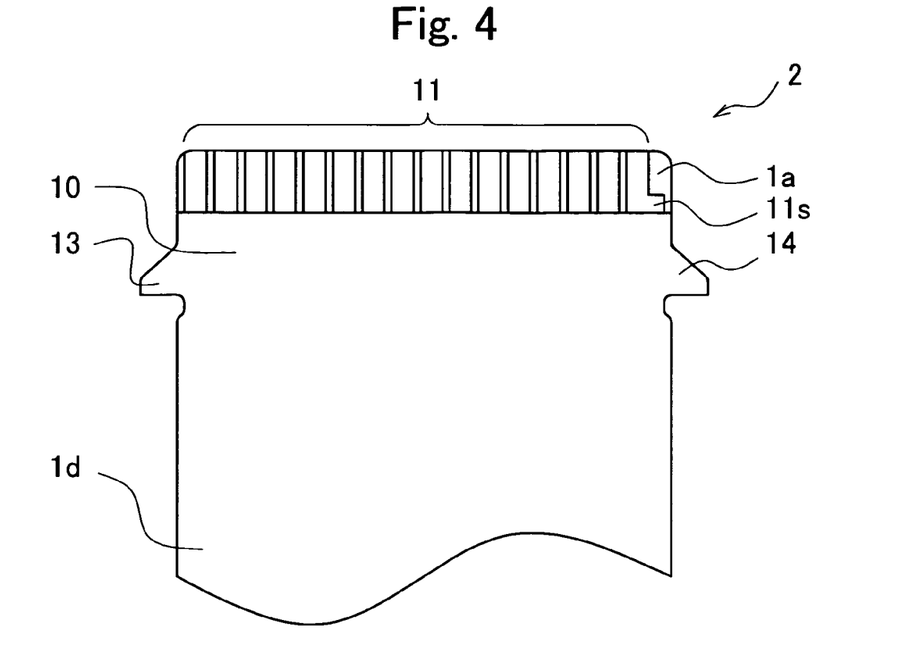
FIG. 4 is a plan view of the double-sided FPC according to Embodiment 2, and is a view of the front face of the double-sided FPC.
Figure 5:
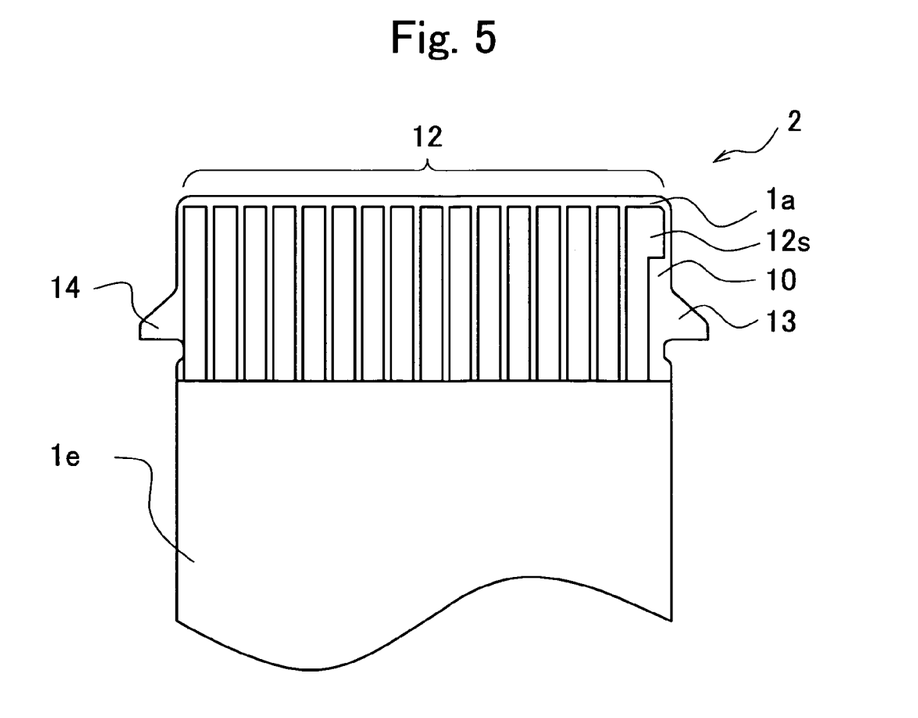
FIG. 5 is a plan view of the double-sided FPC according to Embodiment 2, and is a view of the rear face of the double-sided FPC.

FIG. 1 is a top view of an embodiment of the double-sided FPC according to the present invention. FIG. 2 is a plan view of Embodiment 1 of the double-sided FPC according to the present invention and of one face (front face) of the FPC. FIG. 3 is a plan view of the double-sided FPC according to Embodiment 1, and is a view of the other face (rear face) of the FPC. FIG. 4 is plan view of Embodiment 2 of the double-sided FPC according to the present invention. FIG. 4 is a view of one face (front face) of the FPC. FIG. 5 is a plan view of the double-sided FPC according to Embodiment 2, and is a view of the other face (rear face) of the FPC. FIGS. 6A and 6B are enlarged views of main parts of the double-sided FPC according to Embodiment 2. FIG. 6A is an enlarged view of a first conductive pattern at an end, and FIG. 6B is an enlarged view of a second conductive pattern at an end. FIG. 7 is a side view of the double-sided FPC according to Embodiment 2.

First, a configuration of the double-sided FPC according to Embodiment 1 of the present invention is explained. In FIG. 7, copper foil $1b$ and $1c$ is laminated on both faces of a base $1a$. The base $1a$ is formed as a film, made of a flexible substrate such as insulating polyester, polyimide, or the like. The copper foil $1b$ and $1c$ is bonded to both faces of the base $1a$ by thermosetting binding material $1f$ and $1g$.

As shown in FIG. 2 or 3, the copper foil $1b$ and $1c$ is etched to form pluralities of first and second conductive patterns 11 and 12. The pluralities of first and second conductive patterns 11 and 12 are coated with an insulating coverlay $1d$ and $1e$, respectively. The coverlays $1d$ and $1e$ are formed of a thin film of polyester, polyimide, or the like.

The front face of the terminal 10, for making contact with a connector, is not coated with the insulating coverlay $1d$, and the plurality of first conductive patterns 11 is disposed in parallel and exposed (see FIG. 2). In the same way, the rear face of the terminal 10 is not coated with the insulating coverlay $1e$, and the plurality of second conductive patterns 12 is disposed in parallel and exposed (see FIG. 3).

The first and second conductive patterns 11 and 12 of the terminal 10 are conductively in contact with first and second contacts provided on a connector. An end-terminal of the double-sided FPC 1 connected to the connector is also referred to as an edge connector, and this edge connector may, for example, be given a nickel-gold plating.

The double-sided FPC 1 of the present invention may be configured so that the pluralities of first and second conductive patterns 11 and 12 are disposed in parallel and separated, between the base $1a$ and the coverlays $1d$ and $1e$, and the terminal 10 with the coverlays $1d$ and $1e$ is peeled for a prescribed length only, to expose the first and second conductive patterns 11 and 12, thus forming the terminal 10.

As shown in FIG. 1, the plurality of first conductive patterns 11 ($11a$ to $11e$) disposed on one face of the terminal 10 is disposed staggered by a half pitch with respect to the plurality of second conductive patterns 12 ($12a$ to $12e$) disposed on the other face of the terminal 10. The plurality of first conductive patterns 11 is pressed upon at the contact points of the plurality of first contacts arranged on the connector. Moreover, the plurality of second conductive patterns 12 is pressed upon at the contact points of the plurality of second contacts arranged on the connector.

In the double-sided FPC 1 of the present embodiment, the conductive patterns 12 on the rear face are exposed to a longer extent than the conductive patterns 11 on the front face. As shown in FIGS. 2 and 3, in the terminal 10, coating length of the coverlays $1d$ and $1e$ on the front face is different from the rear face. This is because the contact point positions of the first and the second contacts provided on the connector are different on the front face and the rear face of the double-sided FPC 1.

As shown in FIG. 1 or FIG. 7, the contact points of the first contacts press upon the plurality of conductive patterns 11 with a force P1. Moreover, the contact points of the second contacts press upon the plurality of conductive patterns 12 with a force P2.

Figure 6:
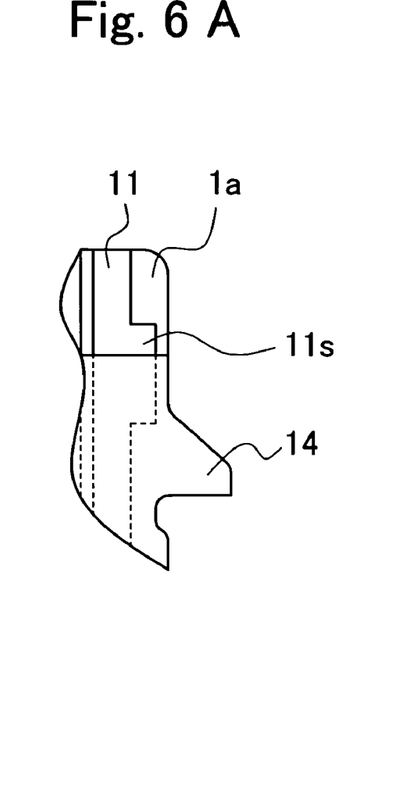
FIGS. 6A and 6B are enlarged views of main parts of the double-sided FPC according to Embodiment 2.
Figure 7:
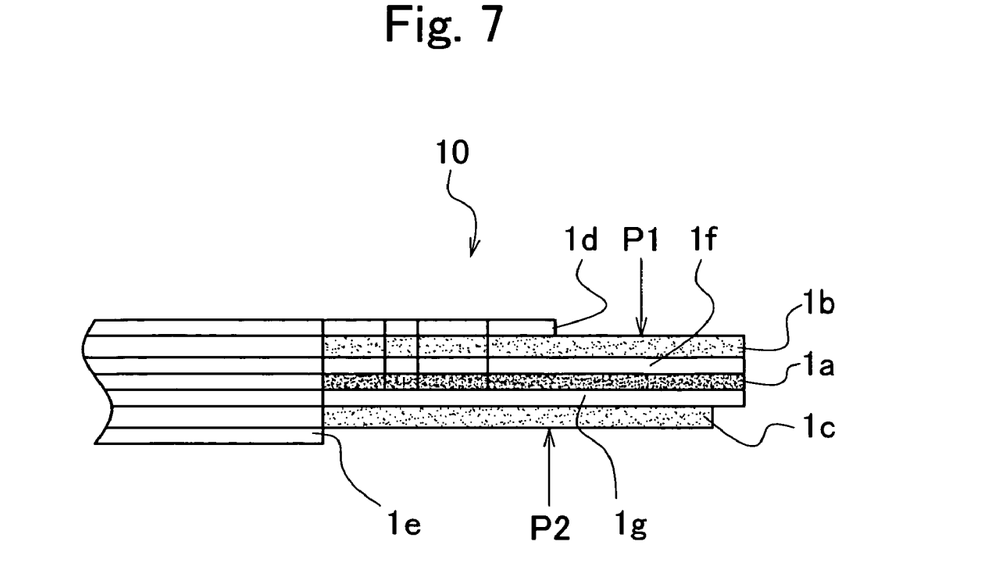
FIG. 7 is a side view of the double-sided FPC according to Embodiment 2.

In FIGS. 4 to 6, the double-sided FPC 2 according to Embodiment 2 is latched to the connector, and a pair of convex pieces 13 and 14 that can prevent the double-sided FPC 2 moving in a direction opposite to that of insertion, are provided on the terminal 10. Furthermore, in the double-sided FPC 2 according to Embodiment 2, only the pair of convex pieces 13 and 14 is added to the double-sided FPC 1 according to Embodiment 1, and the configuration is otherwise the same as the double-sided FPC 1 according to Embodiment 1. The connector applicable to the double-sided FPC according to the present invention is preferably a ZIF connector.

This type of ZIF connector, for example, as shown in FIG. 1, includes an insulating housing 64, in which a concave region $64a$, into which the double-sided FPC is inserted, is formed, and pluralities of first and second contacts mounted side by side at a prescribed pitch in the housing 64; and in order to press upon and put in contact the first and the second contacts, with the double-sided FPC, for example, a cover housing 65, that opens and closes, is arranged at the concave region $64a$.

As shown in FIG. 1, in the double-sided FPC 1, an area $12s$ (see FIG. 3) opposing a contact point of the first contacts, that presses upon a first conductive pattern $11a$ disposed at one end, is reinforced by copper foil $1c$ extending from a second conductive pattern $12a$ disposed at the one end (see FIG. 3). Moreover, an area $11s$ opposing a contact point of the second contacts, that presses upon a second conductive pattern $12e$ disposed at the other end, is reinforced by copper foil $1b$ extending from a first conductive pattern $11e$ disposed at the other end (see FIG. 2).

In the double-sided FPC 1 in FIG. 2, for example, the thickness of the terminal thereof is about 0.12 mm. In the double-sided FPC 1 with this type of thin terminal 10, as it is similar to conventional cases, with force from the contact points of the contacts, both ends of the base $1a$ deform due to creep.

In the areas $11s$ and $12s$ opposing the contact point positions of the first and the second contacts, by the exposed face of the base $1a$ having the copper foil $1b$ and $1c$, being thin metal plates, bonded thereto, the rigidity of both ends of the base $1a$ is reinforced, and it was confirmed by the inventor that deformation does not occur. By laminating (bonding) the copper foil $1b$ and $1c$ to the base $1a$, the second moment of area is considered to be higher than the bending moment of the terminal 10.

The copper foil that extends from the conductive patterns 11 and 12 may, for example, extend in a rectangular shape from the conductive patterns 11 and 12 like an open stub (see FIG. 6), or may extend in a semicircular shape, preferably having a large area with the contact point position as center. These reinforced areas $11s$ and $12s$ can be made by a process of etching the pluralities of first and second conductive patterns 11 and 12. In the double-sided FPC of the present invention, both ends of the terminal can be reinforced without changing the conventional terminal-board thickness.

In the double-sided FPC of the present invention, the board thickness of the base may be 25 micrometers, and the pitch of the first and the second conductive patterns of the double-sided FPC terminal may be 0.4 mm. In the double-sided FPC of the present invention, with regard to electrical signal wires (number of poles) for transmission by the double-sided FPC, the width of the double-sided FPC can be narrowed. Furthermore, the width of the connector connected to the double-sided FPC can be narrowed.

The connector applicable to the double-sided FPC according to the present invention is, for example, an 80-pole connector with a connector pitch of 0.2 mm. The connector applicable to the double-sided FPC according to the present invention may have a low profile and be small. This type of connector is very useful in thin and small electronic devices of recent years.

While preferred embodiments of the present invention have been described and illustrated above, it is to be understood that they are exemplary of the invention and are not to be considered to be limiting. Additions, omissions, substitutions, and other modifications can be made thereto without departing from the spirit or scope of the present invention. Accordingly, the invention is not to be considered to be limited by the foregoing description and is only limited by the scope of the appended claims.

What is claimed is:

1. A double-sided flexible printed circuit comprising:
   an electrically insulating base, the base being electrically insulating;
   a first copper layer laminated on a face of the electrically insulating base, the first copper layer having a first conductive pattern, the first conductive pattern including a plurality of first conductive pads arranged in a juxtaposed relationship;
   a second copper layer laminated on another face of the electrically insulating base, the second copper layer having a second conductive pattern, the second conductive pattern including a plurality of second conductive pads arranged in a juxtaposed relationship, the second conductive pattern disposed offset from the first conductive pattern; and
   electrically insulating coverlays, the electrically insulating coverlays disposed on a portion of the first copper layer and a portion of the second copper layer, portions of the first copper layer and the second copper layer being exposed, wherein
   a selected end one of the plurality of first conductive pads has a first conductive reinforcement portion projecting laterally outwardly relative to remaining ones of the plurality of first conductive pads, a selected end one of the plurality of second conductive pads has a second conductive reinforcement portion projecting laterally outwardly relative to remaining ones of the plurality of second conductive pads,
   wherein, the first conductive reinforcement portion is opposite to one of the second conductive pads and the second conductive reinforcement portion is opposite to one of the first conductive pads.

2. The double-sided flexible printed circuit according to claim 1, wherein the base has a board thickness of 25 micrometers.

3. The double-sided flexible printed circuit according to claim 1, wherein the first and the second conductive patterns on a terminal have a pitch of 0.4 mm.

4. The double-sided flexible printed circuit according to claim 1, wherein the first conductive patterns are staggered by a half pitch with respect to the second conductive patterns.

5. The double-sided flexible printed circuit according to claim 1, wherein the selected end one of the plurality of first conductive pads is disposed at one end of the electrically insulating base, and the selected end one of the plurality of second conductive pads is disposed at the other end of the electrically insulating base.

* * * * *